United States Patent [19]

McCombs et al.

[11] Patent Number: 4,656,368
[45] Date of Patent: Apr. 7, 1987

[54] HIGH SPEED MASTER-SLAVE FLIP-FLOP

[75] Inventors: Craig C. McCombs; Richard D. Farris, both of Wichita, Kans.

[73] Assignee: NCR Corporation, Dayton, Ohio

[21] Appl. No.: 775,928

[22] Filed: Sep. 13, 1985

[51] Int. Cl.[4] .......................................... H03K 3/284
[52] U.S. Cl. ................................ 307/272 A; 307/279; 307/481; 307/279
[58] Field of Search ...................................... 307/481 307/279; 377/115–117

[56] References Cited

U.S. PATENT DOCUMENTS 3,609,569 7/1970 Todd ................................ 307/272 A
4,181,862 1/1980 Dingwall ............................ 377/117

Primary Examiner—Stanley D. Miller
Assistant Examiner—M. R. Wambach
Attorney, Agent, or Firm—Wilbert Hawk, Jr.; Edward Dugas; Floyd A. Gonzalez

[57] ABSTRACT

A flip-flop including a master section having an input for receiving a data signal and a pair of outputs, one output for providing the data signal state, and one output for providing the data signal state complement, and a slave section having a pair of inputs, one connected to each of the outputs of the master section, and a pair of outputs, one of the outputs of the slave section for providing the data signal state, and one of the outputs of the slave section for providing the data signal state complement. A cross coupling circuit is provided in the slave section for connecting the slave section input for receiving the data signal state to the slave section output for providing the data signal state, and for connecting the slave section input for receiving the data signal state complement to the slave section output for providing the data signal state complement. Pass means are provided in the cross coupling circuit for controlling coupling between the slave section outputs and the slave section inputs, and a clock is provided for controlling the master section and the pass means such that the pass means decouples the cross coupling circuit when the data state and data state complement are provided by the master section outputs to the slave section inputs.

4 Claims, 2 Drawing Figures

HIGH SPEED MASTER-SLAVE FLIP-FLOP

BACKGROUND OF THE INVENTION

The present invention is related to master-slave flip-flops, and is more particularly related to flip-flop circuits which may be placed in a single integrated circuit chip.

Master-slave flip-flops are known in which a data state is held in the master section until a desired clock pulse is applied, at which time the data in the master section is passed to a slave section. The output of the slave section is then determined dependent upon the flip-flop type and the state of the data passed from the master section.

U.S. Pat. No. 3,066,231, issued Nov. 27, 1962 to Slobodzinski et al. for "Flip-Flop Circuit Having Pulse-Forming Networks In The Cross-Coupling Paths," discloses a flip-flop circuit which comprises a pair of cross-connected transistors. A branch control circuit is provided for each transistor in which there is a pulse-forming network to provide voltage pulses greater than the duration of an applied impulse at the input circuit to the transistor.

U.S. Pat. No. 3,100,848, issued Aug. 13, 1963 to Skerritt for "High Speed Multivibrator Having Cross Coupling Circuitry," discloses a multivibrator circuit which comprises two cross coupled similar circuits, each circuit having an input terminal and an output terminal and each including an amplifying device. Increased speed of operation is obtainable through utilization of overdrive capacitors to couple turn-on and turn-off signals to the amplifying devices.

U.S. Pat. No. 3,558,931, issued Jan. 26, 1971 to Chernoske for "Flip-Flop Circuit Particularly For Integration," discloses a flip-flop circuit having cross coupled parallel stages. The disclosed flip-flop uses an extra transistor between an input element and a circuit point directly responsive to the inverted signal of the opposite stage to prevent both outputs from having the same state.

U.S. Pat. No. 3,854,059, issued Dec. 10, 1974 to Nomiya et al. for "Flip-Flop Circuit," discloses a flip-flop circuit formed of a combination of field effect transistors and in which input signals are controlled in the normal logic system by clock pulses of low level.

U.S. Pat. No. 4,270,062, issued May 26, 1981 to Hanna for "'D' Flip-Flop," discloses a "D" flip-flop circuit having a master latch including data input transistors coupled to input terminals, data transfer transistors connected to master latch outputs, and a slave latch connected to the output terminals of the data transfer transistors.

U.S. Pat. No. 4,484,087, issued Nov. 20, 1984 to Mazin et al. for "CMOS Latch Cell Including Five Transistors, And Static Flip-Flops Employing The Cell," discloses a five-transistor CMOS static latch cell useful in static flip-flop applications wherein one embodiment includes an inverting latch cell having a data input node, a data storage node, a complementary data output node, a clock input node for selectively enabling or not enabling the cell, and a pair of voltage supply nodes. The disclosed flip-flop includes a cross coupled switching element having an input connected to the complementary data output node and a switching element output connected to the data storage node.

Other patents which show the state of the art include: U.S. Pat. No. 3,609,569, issued Sept. 28, 1971 to Todd for "Logic System"; U.S. Pat. No. 3,610,965, issued Oct. 5, 1971 to Martin et al. for "Integrated Flip-Flop Circuit"; and U.S. Pat. No. 4,390,987, issued June 28, 1983 to Best for "Multiple Input Master/Slave Flip Flop Apparatus."

SUMMARY OF THE INVENTION

A specific embodiment is disclosed of a flip-flop including a master section having an input for receiving a data signal and a pair of outputs, one output for providing the data signal state, and one output for providing the data signal state complement, and a slave section having a pair of inputs, one connected to each of the outputs of the master section, and a pair of outputs, one of the outputs of the slave section for providing the data signal state, and one of the outputs of the slave section for providing the data signal state complement. A cross coupling circuit is provided in the slave section for connecting the slave section input for receiving the data signal state to the slave section output for providing the data signal state, and for connecting the slave section input for receiving the data signal state complement to the slave section output for providing the data signal state complement. Pass means are provided in the cross coupling circuit for controlling coupling between the slave section outputs and the slave section inputs, and a clock is provided for controlling the master section and the pass means such that the pass means decouples the cross coupling circuit when the data state and data state complement are provided by the master section outputs to the slave section inputs.

An object of the present invention is to provide a flip-flop having a master section for receiving a data signal, a slave section having an output for providing the state of said data signal and a complementary output for providing the complementary state of said data signal, wherein the master section includes a data state output and an inverted data state output for providing the data state and its complement for placement on the outputs of the slave section.

It is another object of the present invention to provide a flip-flop having a slave section including a pair of cross coupled branches in which pass transistors are included in the cross coupling, and a clock for controlling the pass transistor such that when a data state and its complement is received from the master section, the pass transistors are turned off and the branches are decoupled.

It is another object of the present invention to provide a flip-flop having a master section and a slave section, and pass transistors therebetween which, when turned off isolate the master section from the slave section.

It is another object of the present invention to provide a flip-flop which may be fabricated on an integrated circuit chip, and which may be clocked at a fast rate.

These and other objects of the present invention will become apparent from the drawings and preferred embodiment disclosed herein.

DESCRIPTION OF THE PREFERRED EMBODIMENT

Figure 1:
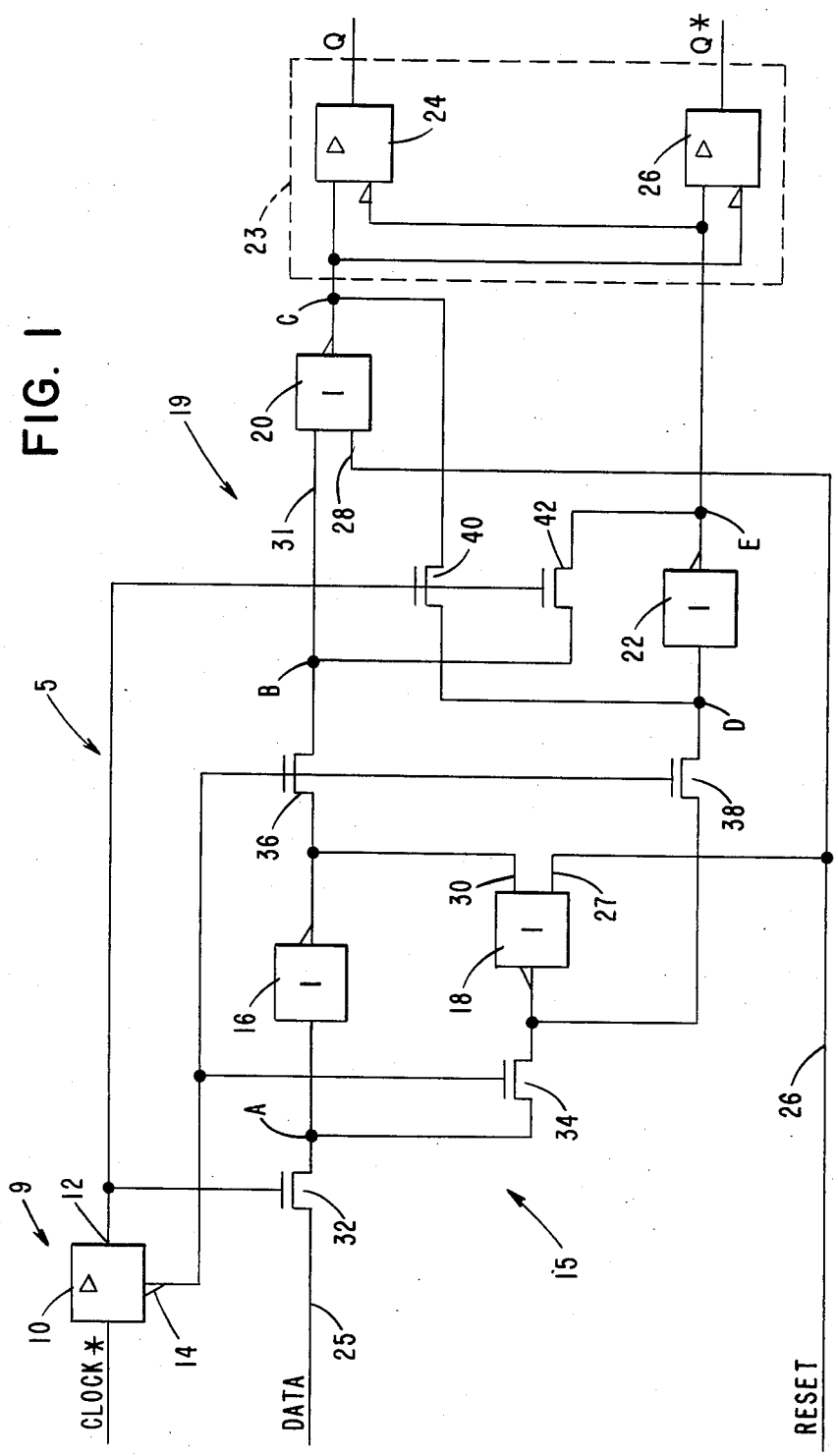
FIG. 1 is a logic schematic diagram of the flip-flop of the present invention.

FIG. 1 is a logic schematic diagram of a flip-flop 5 of the present invention, and includes a clock driver section 9 having a clock driver 10 with a true output 12 and a complementary output 14, a master section 15 including an inverter 16 and a NOR gate 18, and a slave section 19 including a NOR gate 20, an inverter 22, and a push-pull output 23 made up of amplifiers 24 and 26. An active low clock signal (CLOCK*) is inputted into the driver amplifier 10. A data signal (DATA) is inputted on conductor 25 to the master section 15, as will be described. A reset signal (RESET) is inputted over conductor 26 to one input 27 of the NOR gate 18 of the master section 15, and one input 28 of the NOR gate 20 of the slave section 19. It will be understood that, when the RESET signal on the conductor 26 is low, the inputs 27 and 28 of the NOR gates 18 and 20 respectively, are low. In that case, the NOR gates 18 and 20 act as inverters to invert the signals on their other inputs 30 and 31, respectively.

The true output 12 of the clock driver circuit 10 is connected to the gate of a pass transistor 32 which controls the passing of the DATA signal on conductor 25 to node A of the master section 15. The output of the NOR gate 18 is connected to node A through a pass transistor 34 whose gate is connected to the complementary output 14 of the clock driver 10. The slave section 19 includes nodes B and C on either side of NOR gate 20, and nodes D and E on either side of inverter 22. The nodes of the slave section 19 are cross coupled such that node C is connected to node D, and node B is connected to node E. The cross-connection between nodes C and D is controlled by a pass transistor 40, whose gate is connected to the true output 12 of the clock driver 10. The cross-connection between nodes B and E of the slave section 19 is controlled by a pass transistor 42, whose gate is connected to the true output 12 of the clock driver 10. The output of inverter 16 of the master section 15 is connected to node B of the slave section 19 through an isolating transistor 36, and the output of NOR gate 18 of the master section 15 is connected to node D of the slave section 19 through another isolating transistor 38. The output of the inverter 16 of the master section 15 is also connected to the input 30 of the NOR gate 18. The gates of isolating transistors 36 and 38 are connected to the complementary output 14 of the clock driver 10. In the slave section 19, node C is connected to the positive input of amplifier 24 and the negative input of amplifier 26, and node E is connected to the negative input of amplifier 24 and the positive input of amplifier 26. The output of amplifier 24 is the Q output of the flip-flop 5 of FIG. 1, and the output of amplifier 26 is the Q* output.

When the CLOCK* signal is high, the true output 12 of the clock driver 10 will be high, turning on pass transistor 32, thereby passing the DATA signal on conductor 25 to node A. Also, when the CLOCK* signal is high, the complementary output 14 of clock driver 10 will be low, turning off transistors 34, 36 and 38. With pass transistor 34 off, the output of the NOR gate 18 will be isolated from the node A. With the isolating transistors 36 and 38 off, the master section 15 will be isolated from the slave section 19. Thus, the DATA signal on conductor 25 will be inverted by inverter 16, whose output will be inverted by the action of NOR gate 18, assuming that the RESET signal on conductor 26 is low. Both the inverted and non-inverted states of the DATA signal will thus be maintained in the master section 15 waiting for the next transition of the CLOCK* signal. A high on the true output 12 of the clock driver 10 will turn on pass transistors 40 and 42, thereby cross-coupling nodes C and D, and nodes B and E of the slave section 19. Thus, the output of NOR gate 20 on node C will be placed on node D and inverted by inverter 22. The output of inverter 22 will be placed on node E, which is placed on node B through pass transistor 42 to be inverted by the NOR gate 20, assuming that the RESET signal on conductor 26 and input 28 is low, thereby reinforcing the signal on node C. The output of amplifier 24 (the Q output of the flip-flop 5) will have the same state as node C, and the output of amplifier 26 (the Q* output of the flip-flop 5) will have the same state as the E node.

When the CLOCK* signal goes active low, the true output 12 of the clock driver 10 will also go low, turning off pass transistors 32, 40 and 42. At the same time, the complementary output 14 of the clock driver 10 will go high, turning on transistors 34, 36 and 38. In this condition, the inverter 16 and the NOR gate 18 act as a latching circuit to latch the state of the DATA signal on node A at the time that the CLOCK* signal went active low. The DATA signal on node A will be inverted by inverter 16, and the inverted DATA signal, or DATA signal complement, will be passed by the pass transistor 36 from the master section 15 to the slave section 19 and to the input 31 of the NOR gate 20. Again assuming that the RESET signal is low, the inverted data signal on input 31 will again be inverted by inverter 20, to place the state of the DATA signal on node C. Since pass transistor 40 and 42 are off at this time, there is no cross coupling of the nodes B and E, and C and D.

The inverted DATA signal is also inverted by NOR gate 18, and, with the pass transistor 34 turned on, fed back to node A to maintain the state of the DATA signal. The state of the DATA signal on the output of NOR gate 18 is also passed by pass transistor 38 from the master section 15 to the slave section 19 and its node D. The state of the data signal will then be inverted by inverter 22 and placed on node E. It will thus be understood that, at the transition of the CLOCK* signal going low, the state of the data signal on node A will be placed on node C, and the inverted state of the DATA signal, or DATA signal complement, will be placed on node E. By the connection of the amplifiers 24 and 26, the state on node C becomes the Q output of the flip-flop 5, and the state on node E becomes the Q* output.

An active high RESET signal on conductor 26 will appear on inputs 27 and 28 of NOR gates 18 and 20, respectively. This will cause the outputs of NOR gates 18 and 20 to go low, causing node C to go low, and node E to go high. If the CLOCK* signal is high, the pass transistor 40 and 42 are turned on, connecting nodes C and D such that the low on node C is inverted by the inverter 22 and placed on node E. If the CLOCK* signal is low, pass transistor 38 is turned on, thereby connecting the low on the output of the NOR gate 18 to the input of the inverter 22. This also places a high on node E. Thus, it will be understood that when the RESET signal is high, the Q output of the flip-flop 5 will be reset low and the Q* output will be reset high, regardless of the state of the CLOCK* and DATA signals.

Figure 2:
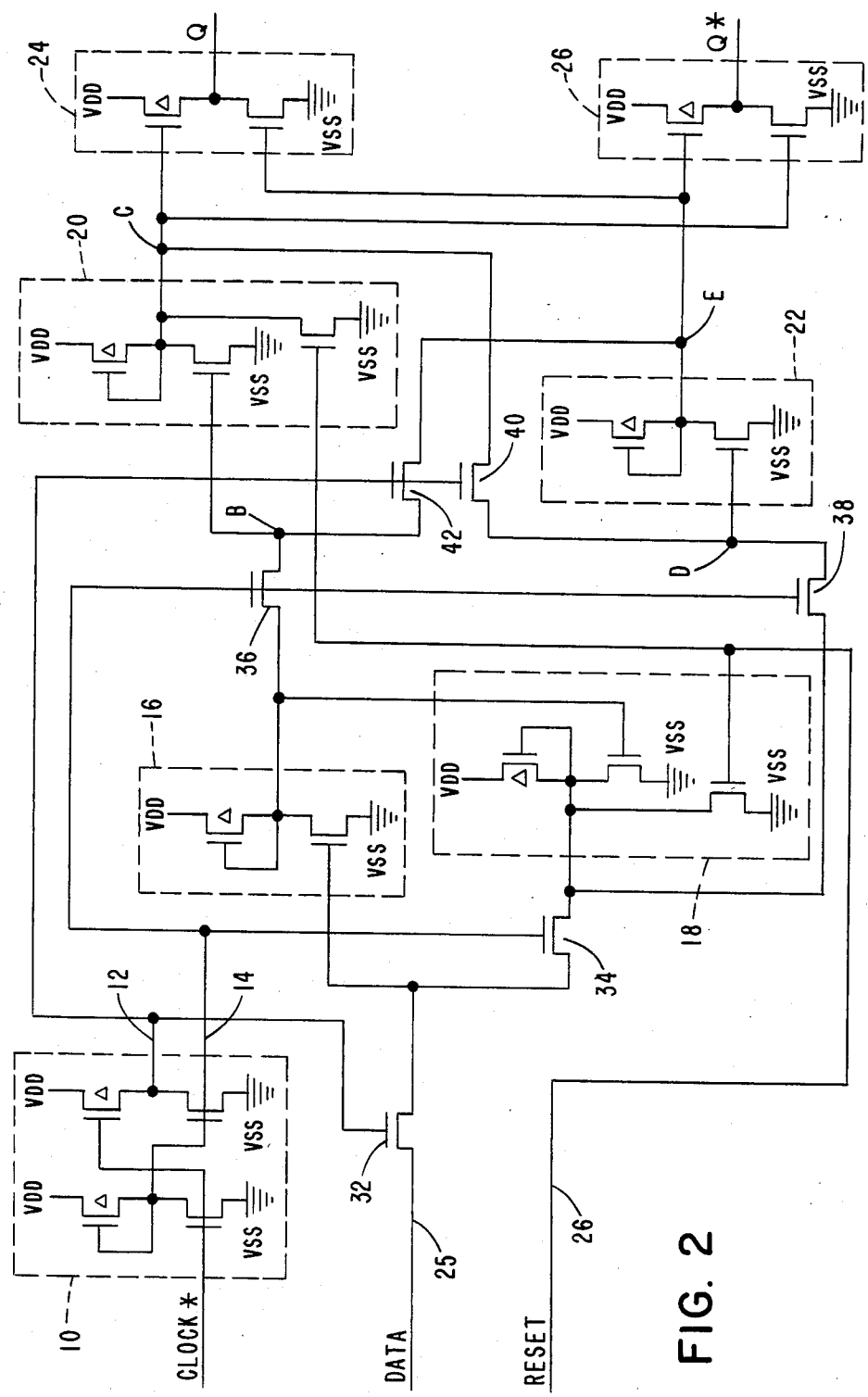
FIG. 2 is a transistor schematic diagram of the flip-flop of FIG. 1.

FIG. 2 is a transistor schematic diagram of the flip-flop 5 of FIG. 1 showing the transistor design of the elements of the clock driver 10, inverters 16 and 22, NOR gates 18 and 20, and the amplifiers 24 and 26. The transistors of FIG. 2 are designed using 3 micron gate NMOS VLSI technology to provide a flip-flop having clocking rates beyond 60 MHz. It will be understood that the disclosed circuit, and the described technology provide a flip-flop 5 which may be placed on an integrated circuit chip, either by itself or with other circuits. The flip-flop 5 of the present invention has been successfully tested with clocking speeds up to 117 MHz, and is able to provide pull up current on the output amplifiers of 200-300 microamps. It will be understood that the transistors and circuit of FIG. 1 may be fabricated by other technologies which are well known by those skilled in the art. Also, a flip-flop 5 having different clocking speeds and pull-up currents may be designed by well known techniques, which will not be discussed further herein.

Thus, a flip-flop has been described which provides the aforementioned objects. It will be understood by those skilled in the art that the disclosed embodiment is exemplary only, and that the various elements disclosed may be replaced by equivalents without departing from the invention hereof, which equivalents are intended to be covered by the appended claims.

What is claimed is:

1. A flip-flop comprising:
   clock means having an input for receiving a clock signal, a clock output having a high state when the clock signal is high and a low state when the clock signal is low, and an inverted clock output having a low state when the clock signal is high and a high state when the clock signal is low;
   a master section having a data input for receiving a data signal, a latching means connected to said clock means for latching the state of the data signal, a master output for providing the state latched by said latching means and an inverted master output for providing the complement of the state latched by said latching means, said latching means comprises a first master section inverter having an input connected to the data input of said master section and an output connected to said inverted master output, a second master section inverter having an input connected to the output of said first master section inverter and an output connected to the input of said first master section inverter and the master output, and a pass transistor connected between the output of said second master section inverter and the input of said first master section inverter and controlled by the state on said inverted clock output for turning off when the state is low and turning on when the state on the inverted clock output is high;
   a slave section having a first slave input connected to said master output, a second inverted slave input connected to said inverted master output, a slave output for providing the state of the latched data signal, and an inverted slave output for providing the inverted state of the latched data signal;
   cross coupling means in said slave section and controlled by said clock output such that said slave output is connected to said first slave input and said second inverted slave output is connected to said inverted slave input when the state of said clock output is high, and said slave output and said inverted slave output are not connected to said first slave input and said second inverted slave input when said clock signal is low; and
   isolation means between said master section and said slave section and controlled by said inverted clock output such that said master section is disconnected from said slave section when there is a low state on said inverted clock output, and said master section is connected to said slave section when there is a high state on said inverted clock output.

2. The flip-flop of claim 1 further comprising a data pass transistor between the data input of the master section and the input of said first master section inverter, said data pass transistor controlled by the state on said clock output such that said data pass transistor is turned on when the state on said clock output is high and turned off when the state on said clock output is low.

3. The flip-flop of claim 2 wherein said slave section includes a first slave section inverter between said first slave input and said inverted slave output, and a second slave section inverter between said second inverted slave input and said slave output.

4. The flip-flop of claim 3 further comprising a reset input for receiving a reset signal; and wherein said second master section inverter and said second slave section inverter are both NOR gates, each of said NOR gates having an input connected to said reset input for resetting said slave output and said inverted slave output to a desired state upon receipt of a reset signal on said reset input.

* * * * *